(12) United States Patent
Oka (10) Patent No.: US 7,267,556 B2
(45) Date of Patent: Sep. 11, 2007

(54) ELECTRICAL JUNCTION BOX

(75) Inventor: Tatsuya Oka, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 0 days.

(21) Appl. No.: 11/490,110

(22) Filed: Jul. 21, 2006

(65) Prior Publication Data

US 2007/0020968 A1   Jan. 25, 2007

(30) Foreign Application Priority Data

Jul. 21, 2005   (JP) .............................. 2005-211453

(51) Int. Cl.
*H01R 12/00* (2006.01)
(52) U.S. Cl. ........................ 439/76.2; 439/75
(58) Field of Classification Search ................ 439/76.2, 439/949, 74, 75
See application file for complete search history.

(56) References Cited

U.S. PATENT DOCUMENTS

| 4,929,185 | A | * | 5/1990 | Wong et al. ................... 439/74 |
| 5,445,526 | A | * | 8/1995 | Hoshino et al. ............... 439/69 |
| 6,761,567 | B2 | * | 7/2004 | Onizuka et al. ............ 439/76.2 |
| 6,893,285 | B1 | | 5/2005 | Chiang |
| 7,165,979 | B1 | * | 1/2007 | Oka ........................... 439/76.2 |
| 2006/0030177 | A1 | * | 2/2006 | Kawakita et al. ........... 439/76.2 |
| 2006/0128181 | A1 | * | 6/2006 | Ishiguro et al. ............ 439/76.2 |
| 2007/0049070 | A1 | * | 3/2007 | Fujimaki .................... 439/76.2 |

FOREIGN PATENT DOCUMENTS

| JP | A-09-028019 | 1/1997 |
| JP | A-09-308049 | 11/1997 |
| JP | A-2001-015952 | 1/2001 |

* cited by examiner

*Primary Examiner*—Neil Abrams
*Assistant Examiner*—Phuongchi Nguyen
(74) *Attorney, Agent, or Firm*—Oliff & Berridge, PLC (57) ABSTRACT

An electrical junction box includes at least three printed boards that constitute an internal circuit. Conductors on the printed boards can be easily connected to one another through a relay connector. The printed boards are contained in a casing assembly so that they are spaced away from one another. A shorter relay connector is mounted on the second printed board disposed at an intermediate position. A longer relay connector is mounted on the third printed board. The longer relay connector projects toward the first printed board through a groove provided in a peripheral edge of the second printed board. Terminals conducted to conductors on the first and third printed boards are connected to each other through a longer relay terminal in the longer relay connector. A terminal conducted to a conductor on either first or third printed board is connected to a shorter relay terminal conducted to the conductor on the second printed board.

22 Claims, 11 Drawing Sheets

ELECTRICAL JUNCTION BOX

This application claims priority from Japanese Application Number 2005-211453, filed Jul. 21, 2005, the entire contents of which are incorporated herein by reference.

BACKGROUND

This invention relates to an electrical junction box to be mounted on a motor vehicle and more particularly relates to an electrical junction box in which printed boards are contained in a casing and conductors on the respective printed boards are interconnected to one another.

Conventionally, a laminated body and circuit bodies such as printed boards are contained in a casing of an electrical junction box to be mounted on a motor vehicle. The laminated body alternately superposes bus bars, which are formed into a desired shape by punching a conductive metal plate, and insulation plates. The printed boards are formed by printing a conductor made of a copper foil or the like onto an insulation board in a desired circuit pattern. In the case where the circuit bodies are contained in a single casing in plural laminated layers, the conductors on the respective circuits are connected to one another through a relay connector.

Figure 11:
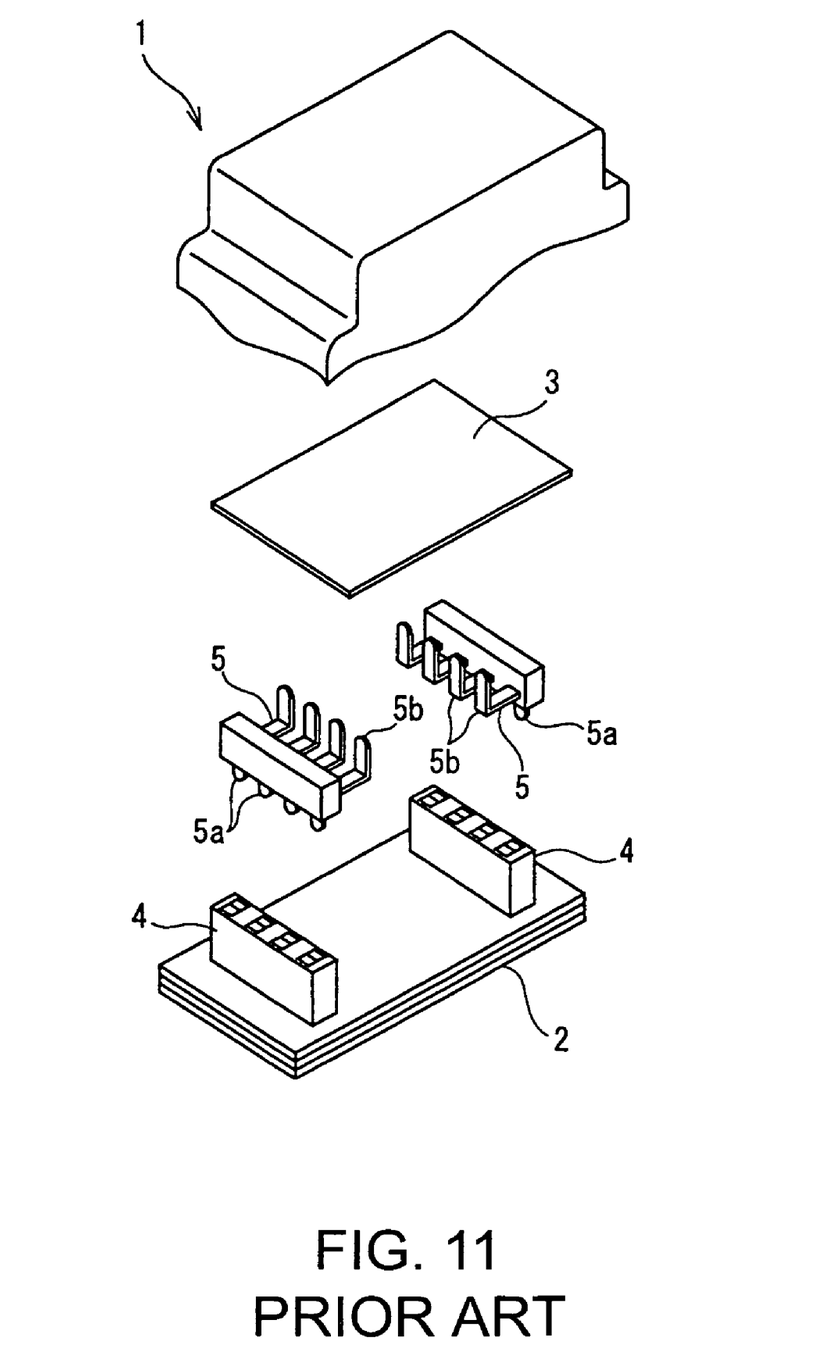
FIG. 11 is an exploded perspective view of a conventional electrical junction box.

An electrical junction box 1 that contains such a kind of relay connector has been disclosed in Japanese Patent Public Disclosure No. 2001-15952 (JP-A-2001-15952). As shown in FIG. 11, the electrical junction box 1 includes a bus bar laminated body 2 and a printed board 3. Housings (relay connectors) 4 each containing a relay terminal (not shown) stand on an insulation plate in the bus bar laminated body 2. The relay terminal in the housing 4 is connected to a bus bar in the bus bar laminated body 2 from a bottom side and to an end 5a of a connection terminal 5 from a top side. The other end 5b of the connection terminal 5 is soldered to a conductor on the printed board 3. Thus, the bus bar in the bus bar laminated body 2 is connected to the conductor on the printed board 3.

Also, a connection structure utilizing the relay connector disclosed in JP-A-2001-15952 can be applied to the connection between conductors on printed boards by mounting a housing similar to the housing 4 on the printed board.

SUMMARY

However, the number of circuits has increased in association with a rapid increase of currently installed electrical equipment. If two circuit bodies constitute a desired circuit, each circuit body will be enlarged in a horizontal direction and the electrical junction box also will be enlarged in the horizontal direction.

If three circuit bodies are contained in a casing of the electrical junction box and are separated from one another in a vertical direction and conductors on the respective circuit bodies are connected to one another, it would be possible to reduce the size of the respective circuit bodies. However, the relay connector mentioned above will have a complex connection structure and a terminal that interconnects conductors on upper and lower circuit bodies will be elongated, thereby requiring difficult connecting work.

In view of the above problems, an object of the present invention is to provide an electrical junction box in which at least three printed boards constitute an internal circuit, the respective printed boards are reduced in size, and conductors on the printed boards can be easily connected to one another through a relay connector.

In order to solve the above problems, exemplary embodiments of the present invention provide an electrical junction box characterized by the following structure. First, second, and third printed boards are contained in a casing assembly so that the boards are spaced away from one another in a vertical direction. A lower, shorter relay connector projecting toward the first printed board is mounted on the second printed board disposed at an intermediate position. A taller, longer relay connector projecting toward the first and second printed boards is mounted on the third printed board. The longer relay connector projects toward the first printed board through a groove provided in a peripheral edge of the second printed board. A longer relay terminal is accommodated in a terminal containing chamber in the longer relay connector. Terminals accommodated in the terminal containing chamber and conducted to conductors on the first and third printed boards are connected to each other through the longer relay terminal. A shorter relay terminal conducted to a conductor on the second printed board is accommodated in a terminal containing chamber in the shorter relay connector. A terminal accommodated in the terminal containing chamber in the shorter relay connector and conducted to a conductor on either the first or third printed board is connected to the shorter relay terminal.

According to the above structure, it is possible to interconnect the terminal conducted to the conductor on the first printed board and the terminal conducted to the conductor on the third printed board through the longer relay terminal accommodated in the terminal containing chamber in the longer relay connector mounted on the third printed board. It is also possible to interconnect the terminal conducted to the conductors on the first and third printed boards and the conductor on the second printed board through the shorter relay terminal accommodated in the terminal containing chamber in the shorter relay connector mounted on the second printed board.

Thus, since the internal circuit in the electrical junction box is divided into at least three printed boards, it is possible to reduce the size of the respective printed boards and thus the electrical junction box.

Since the longer relay connector mounted on the third printed board projects toward the first printed board through the groove in the second printed board, the terminal conducted to the conductor on the first printed board and the terminal conducted to the conductor on the third printed board can be readily coupled to each other without enlarging them in the horizontal direction.

Furthermore, when the shorter relay terminal in the shorter relay connector mounted on the second printed board is coupled to the terminal conducted to the conductor on the third printed board, the longer relay connector, which connects the terminal conducted to the conductor on the first printed board to the terminal conducted to the conductor on the third printed board, merely passes through the groove in the second printed board. Accordingly, since the work for connecting the terminal conducted to the conductor on the third printed board to the longer relay terminal to each other is not performed, the effort required to connect them will be reduced, thereby facilitating the assembly work.

In embodiments of the invention, the longer relay connector on the third printed board is provided with a taller, longer section and a lower, shorter section integrated with the taller, longer section. The longer relay terminal is accommodated in a terminal containing chamber in the longer section. A terminal conducted to the conductor on the third printed board is inserted into and held in the terminal containing chamber in the shorter section. A projecting end of the terminal is inserted into the terminal containing chamber in the shorter relay connector on the second printed board to be connected to the shorter relay terminal.

According to the above structure, since the terminal conducted to the conductor on the third printed board is held in the terminal containing chamber in the shorter section of the longer relay connector mounted on the third printed board, it is possible to reduce any load applied to the solder that connects the conductor on the third printed board to the terminal, thereby reducing the possibility of cracks in the solder.

Preferably, the terminal containing chamber for the shorter relay terminal is provided on each of opposite side sections of the shorter relay connector on the second printed board. A central section between the opposite side ends is provided with a recess or a through-hole. The recess or the through-hole is located at a position opposed to the groove in the second printed board. The longer relay connector mounted on the third printed board projects from the second printed board toward the first printed board through the groove in the second printed board and the recess or the through-hole in the central section.

According to the above structure, it may be possible to enhance the strength of the shorter relay connector, since separated shorter relay connectors are not mounted on the same side of the second printed board at a certain spaced distance and the recess or through-hole is provided in the central section at the position opposed to the groove in the second printed board to form a single shorter relay connector. Accordingly, when the terminals conducted to the conductors on the first and third printed boards are connected to the shorter relay terminal in the shorter relay connector, it may be possible to reduce the possibility that breaks or disconnects occur between the shorter relay connector and the second printed board.

It is also possible to facilitate the operation of mounting a relay connector onto a printed board in comparison with the case in which separated shorter relay connectors are mounted and spaced on the same side of the second printed board.

Shorter relay connectors may be mounted on opposite sides of the groove in the second printed board. The longer relay connector mounted on the third printed board may project from the second printed board toward the first printed board through the groove in the second printed board and a space between two shorter relay connectors mounted on the second printed board.

In some embodiments of the present invention, a board-mounted relay is mounted on the third printed board. Multiplex operation circuits are mounted on the second printed board.

According to those embodiments, it is possible to efficiently arrange the internal circuits in the electrical junction box by concentrating and arranging the multiplex operation circuits on the second printed board. Particularly, since the third printed board including power circuits having a high calorific value is disposed near an exterior of the casing assembly and the second printed board including signal circuits (communication circuits) having a low calorific value is disposed in an inner side of the casing assembly between the first and third printed boards, it is possible to obtain a suitable arrangement for heat radiation.

It is also possible to optimize the thickness of a conductor on each of the second and third printed boards by concentrating and arranging the signal circuits on the second printed board and the power circuits on the third printed board.

Furthermore, even if communication circuits are subject to alteration, it is possible to accommodate the alteration by changing the thickness of the second printed board.

A laminated body that layers bus bars and insulation plates alternately may be mounted on a surface of the first printed board and/or the third printed board opposite from the second printed board. The bus bar and the conductors on the first printed board, the second printed board and/or the third printed board may be connected directly or through the relay terminal to each other.

As described above, according to the above structure, it is possible to interconnect the terminal conducted to the conductor on the first printed board and the terminal conducted to the conductor on the third printed board through the longer relay terminal accommodated in the terminal containing chamber in the longer relay connector mounted on the third printed board. It is also possible to interconnect the terminal conducted to the conductors on the first and third printed boards and the conductor on the second printed board through the shorter relay terminal accommodated in the terminal containing chamber in the shorter relay connector mounted on the second printed board.

Thus, since the internal circuit in the electrical junction box is divided into at least three printed boards, it is possible to reduce the size of the respective printed boards and thus the electrical junction box.

Since the longer relay connector mounted on the third printed board projects toward the first printed board through the groove in the second printed board, the terminal conducted to the conductor on the first printed board and the terminal conducted to the conductor on the third printed board can be readily coupled to each other without making them longer.

Furthermore, when the shorter relay terminal in the shorter relay connector mounted on the second printed board is coupled to the terminal conducted to the conductor on the third printed board, the longer relay connector, which connects the terminal conducted to the conductor on the first printed board to the terminal conducted to the conductor on the third printed board, passes the groove in the second printed board. Accordingly, the effort required to connect them will be reduced, thereby facilitating assembly work.

Those and other objects, advantages and features are described in or apparent from the following detailed description.

BRIEF DESCRIPTION OF THE DRAWINGS

Exemplary embodiments will be described in connection with the attached drawings, in which like numerals represent like parts, and in which.

DETAILED DESCRIPTION OF EMBODIMENTS

Referring now to the drawings, exemplary embodiments of an electrical junction box in accordance with the present invention will be described below.

FIGS. 1 through 7 show a first embodiment of an electrical junction box in accordance with the present invention. An electrical junction box 10 includes a casing assembly including an upper casing 11, an intermediate casing 12, and a lower casing 13. A laminated body 20, which layers bus bars 21 and insulation plates 22 alternately, and first, second, and third printed boards 30, 40, and 50 are contained in and secured to the casing assembly so that they are spaced away from one another in a vertical direction. The bus bars 21 and conductors 31 (not shown—corresponds to 41, 51, but is on board 30), 41, and 51 on the first, second, third printed boards 30, 40, and 50 are connected to given terminals through a shorter relay connector 60 mounted on the second printed board 40 or a longer relay connector 70 mounted on the third printed board 50.

Figure 1:
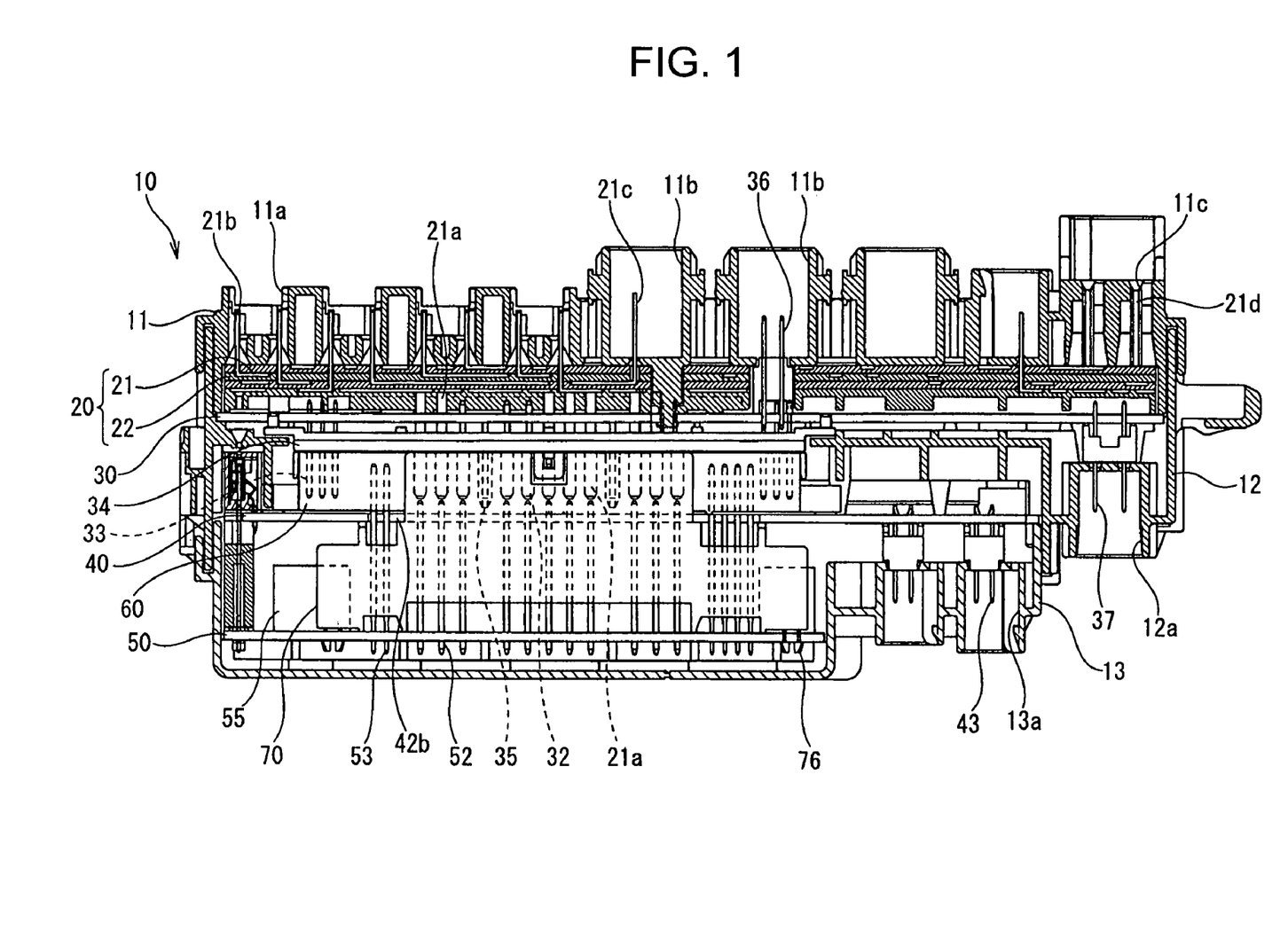
FIG. 1 is a sectional view of an electrical junction box of a first embodiment in accordance with the present invention.
Figure 2A:
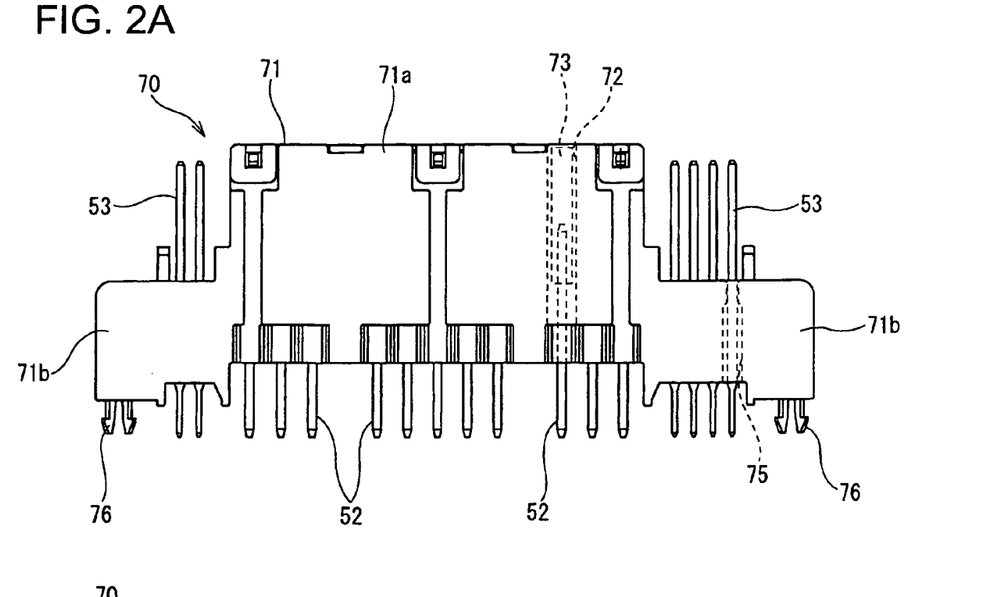
FIG. 2A is a front elevation view of a longer relay connector to be mounted on a third printed board.
Figure 2B:
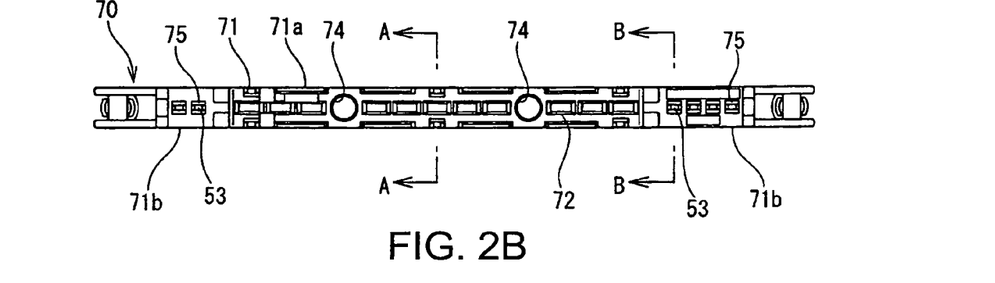
FIG. 2B is a plan view of FIG. 2A.
Figure 2C:
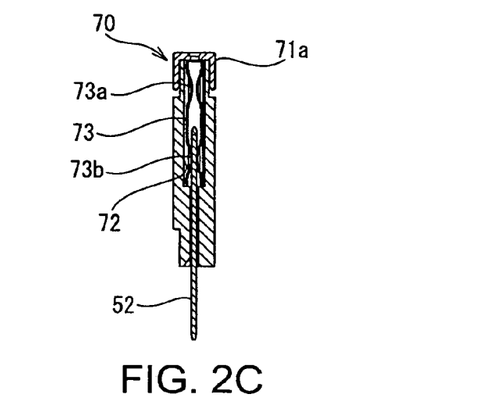
FIG. 2C is a cross section view taken along line A-A in FIG. 2B.
Figure 2D:
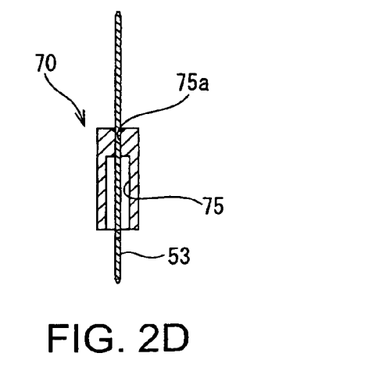
FIG. 2D is a cross section view taken along line B-B in FIG. 2B.

In more detail, the laminated body 20 and first printed board 30 are contained in a space enclosed by the upper casing 11 and intermediate casing 12 so that the laminated body 20 is superposed on the first printed board 30 with respect to a vertical direction. The second and third printed boards 40 and 50 are contained in a space enclosed by the intermediate casing 12 and lower casing 13 so that they are spaced away from each other with respect to the vertical direction.

A housing 71 of a taller, longer relay connector 70 is mounted on an upper side of the third printed board 50. As shown in FIG. 2, the housing 71 includes a central, taller, longer section 71a and lower, shorter opposite side sections 71b. The lower, shorter sections 71b are integrated together with the opposite sides of the central, taller, longer section 71a so that the central section 71a projects upward from the opposite side sections 71b. An upper end of the longer section 71a projects through a groove 42b (described below) in the second printed board 40 into the first printed board 30.

Figure 3:
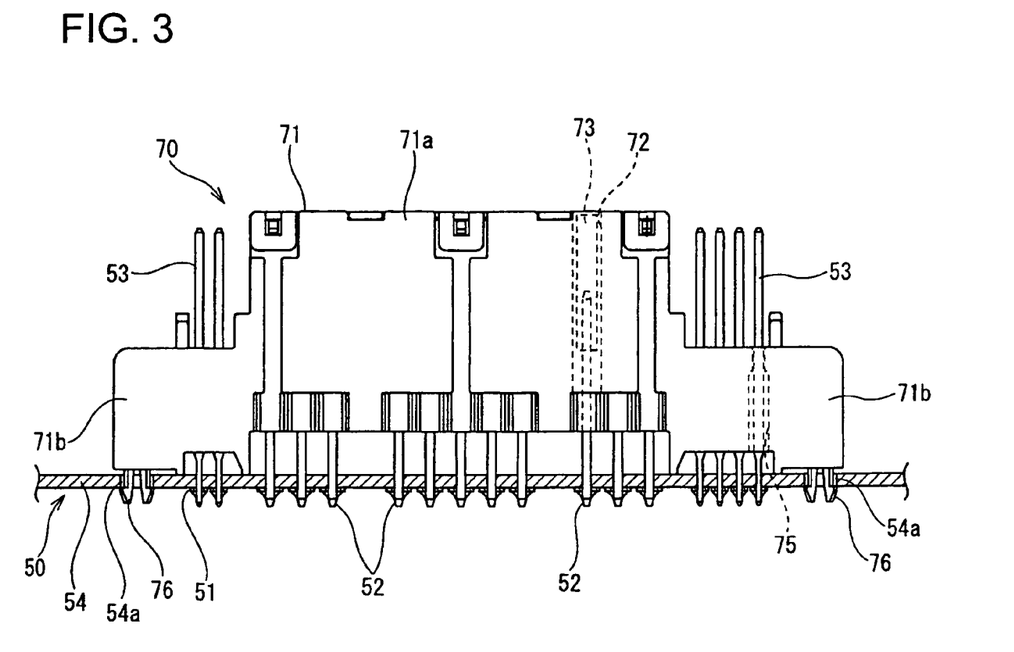
FIG. 3 is a front elevation view of a longer relay connector mounted on the third printed board.
Figure 4A:
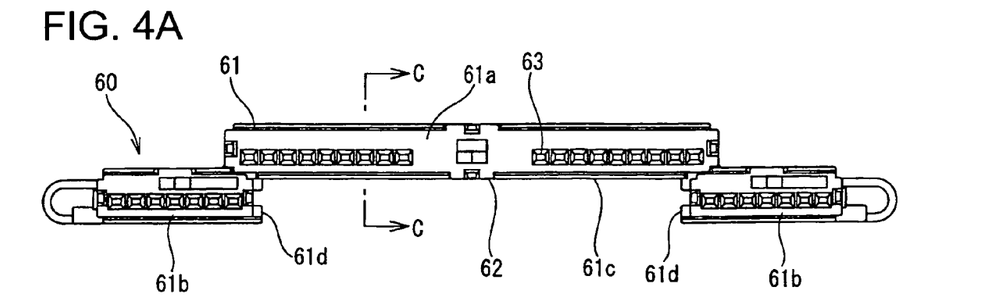
FIG. 4A is a plan view of a shorter relay connector to be mounted on a second printed board.
Figure 4B:
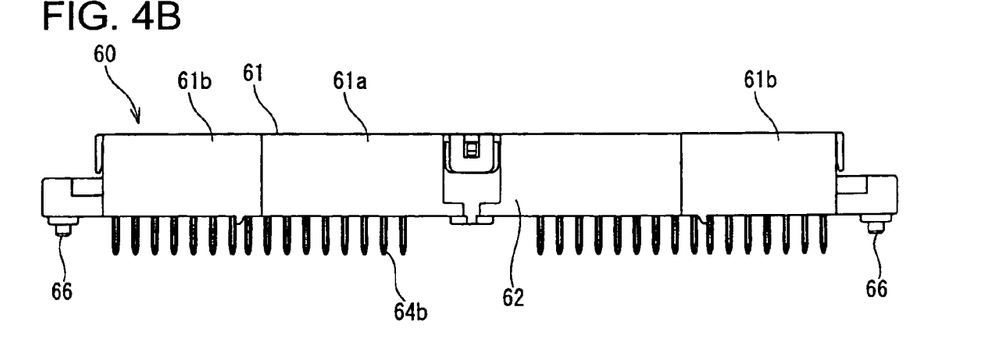
FIG. 4B is a front elevation view of FIG. 4A.
Figure 4C:
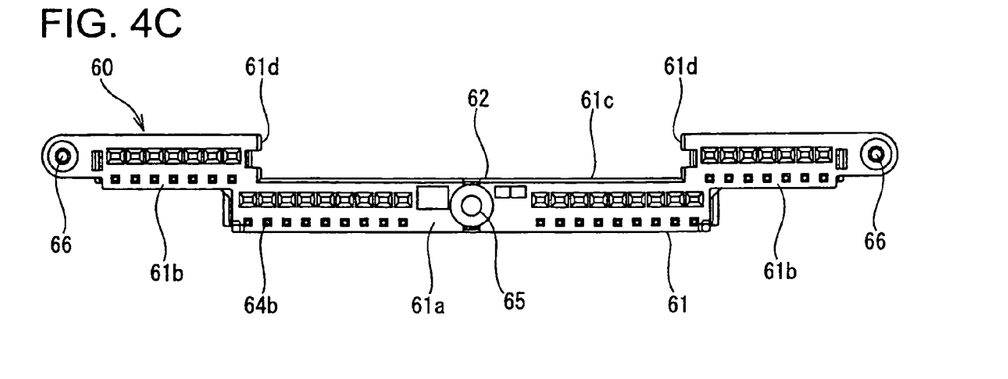
FIG. 4C is a bottom side elevation view of FIG. 4A.
Figure 4D:
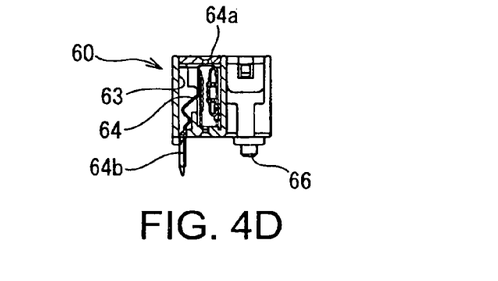
FIG. 4D is a cross section view taken along line C-C in FIG. 4A.

A plurality of terminal containing chambers 72 are juxtaposed in the longer section 71a of the housing 71 so that each chamber 72 penetrates the section 71a in a vertical direction. A longer relay terminal 73 having upper and lower female terminal portions 73a and 73b is accommodated in each of the terminal containing chambers 72. As shown in FIG. 1, a terminal 32 is soldered on a conductor 31 (not shown) on the first printed board 30. The terminal 32 or a tab 21a provided on the bus bar is inserted downward into the terminal containing chamber 72 so that the terminal 32 or the tab 21a is fitted in the upper female terminal portion 73a of the longer relay terminal 73. As shown in FIG. 3, a terminal 52 conducted to a conductor 51 on the third printed board 50 by soldering is inserted upward into the terminal containing chamber 72 so that the terminal 52 is fitted in the lower female terminal portion 73b of the longer relay terminal 73. That is, the terminal 32, which is connected to the conductor 31 on the first printed board 30, the tab 21a provided on the bus bar 21, and the terminal 52, which is connected to the conductor 51 on the third printed board 50, are connected through the long relay terminal 73 to one another. The longer section 71a of the housing 71 is provided on predetermined positions between the terminal containing chambers 72 with guide grooves 74 that receive guide rods 35 (described after).

A plurality of terminal containing chambers 75 are juxtaposed in the shorter section 71b of the housing 71 so that each chamber 75 penetrates the section 71b in the vertical direction. A terminal 53 conducted to the conductor 51 on the third printed board 50 passes each terminal containing chamber 75. The terminal containing chamber 75 includes a greater diameter portion at a lower side and a smaller diameter portion at an upper side. An inner surface of the smaller diameter portion is brought into contact with an outer surface of the terminal 53 to hold the terminal 53. The shorter section 71b is provided on the opposite sides of a lower end surface with clips 76. The clips 76 are inserted into and held in engagement holes 54a in a base plate 54 of the third printed board 50.

The conductor 51 on the third printed board 50 in this embodiment has a thickness of 70 µm although any appropriate conductor thickness may be used with this invention. A board mounting relay 55 that controls an electrical power supply to a wiper or headlights is coupled to the conductor 51 in this embodiment, although any of the printed boards may be used for any necessary purpose.

A housing 61 of a lower, shorter relay connector 60 is mounted on an upper surface of the second printed board 40. The housing 61 includes a longer central section 61a and opposite side sections 61b that project laterally from opposite ends of a front side 61c (lower side in FIG. 4A) of the central section 61a. That is, the opposite side sections 61b are arranged ahead of the central section 61a. Inner side end surfaces 61d of the opposite side sections 61b and the front surface 61c of the central section 61a define a recess 62.

A plurality of terminal containing chambers 63 are juxtaposed in the central section 61a and opposite side sections 61b of the housing 61 so that each chamber 63 penetrates the sections 61a and 61b in the vertical direction. Each terminal containing chamber 63 accommodates a shorter relay terminal 64 having a female terminal portion 64a and a male terminal portion 64b conducted to the female terminal portion 64a. The male terminal portion 64b of the shorter relay terminal 64 projects down outward from a bottom surface of the housing 61. The central section 61a is provided in a central bottom surface with a threaded hole 65. The opposite side sections are provided on opposite ends of bottom surfaces with positioning protrusions 66.

Figure 5A:
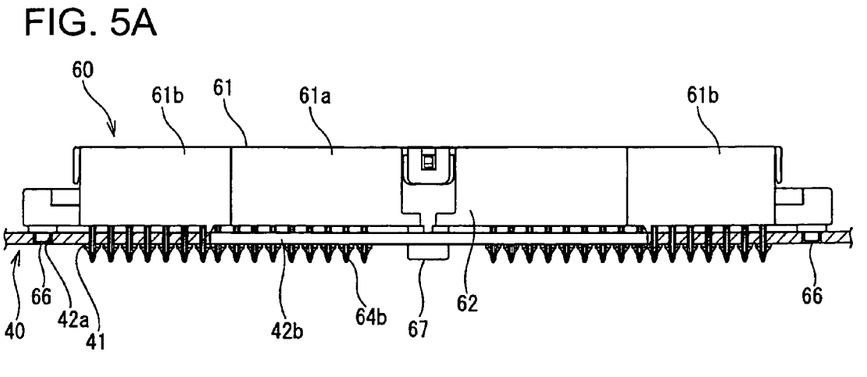
FIG. 5A is a sectional view of the shorter relay connector mounted on the second printed board.
Figure 5B:
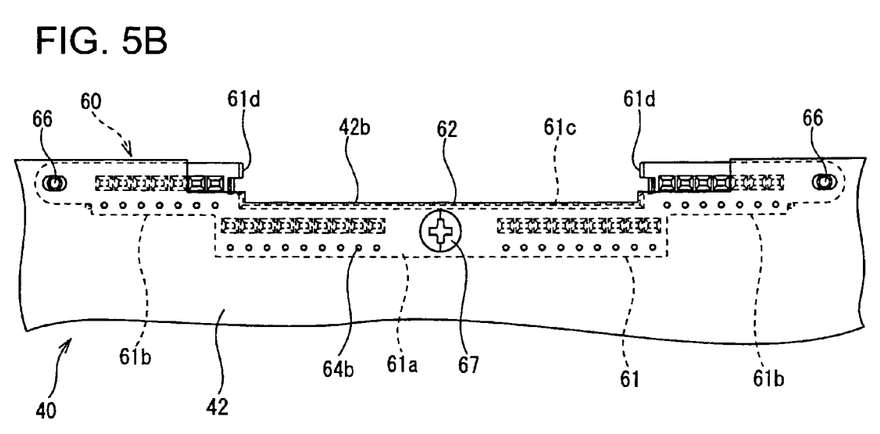
FIG. 5B is a bottom side elevation view of FIG. 5A.

As shown in FIG. 5, the shorter relay connector 60 is located at a predetermined position on the base plate 42 of the second printed board 40 by inserting the positioning protrusions 66 on the bottom end surface of the housing 61 into through-holes 42a in the base plate 42. Under this condition, a screw 67 is inserted via the through-hole (not shown) in the base plate 42 at the bottom side of the base plate 42 into the threaded hole 65 in the housing 61, so that the shorter relay connector 60 is secured to the base plate 42 by the screw 67. The male terminal portion 64b of the shorter relay terminal 64 is soldered on the conductor 41 on the second printed board 40.

The base plate 42 of the second printed board 40 is provided with a groove 42b at a position corresponding to the recess 62 in the shorter relay connector 60. The opposite side sections 61b partially project on the groove 42b. The terminal containing chambers 63 are provided in the opposite side sections 61b extending on the groove 42b. As shown in FIG. 1, the terminal 53, which is conducted to the conductor 51 on the third printed board 50 by soldering, is inserted upward into each terminal containing chamber 63 so that the terminal 53 is fitted in the female terminal portion 64a. On the other hand, the terminal containing chambers 63 are provided in the central section 61a and the opposite side sections 61b disposed on the base plate 42 of the second printed board 40. The terminal 33, which is conducted to the conductor 31 on the first printed board 30 by soldering, is inserted downward into each terminal containing chamber 63 so that the terminal 33 is fitted in the female terminal portion 64a. Thus, the conductor 41 on the second printed board 40 is connected through the terminal 53 and shorter relay terminal 64 to the conductor 51 on the third printed board 50 while the conductor 41 on the second printed board 40 is connected through the terminal 33 and shorter relay terminal 64 to the conductor 31 on the first printed board 30.

In this embodiment, a multiplex operation circuit is provided on the second printed board 40 although any appropriate device may be mounted on the board with this invention. Various kinds of electronic devices may be mounted on the conductor 41 of any appropriate thickness, with this embodiment having a conductor having a thickness of 18 μm.

The terminals 32 and 33, which are conducted to the conductor 31 on the first printed board 30 by soldering, project down toward the second printed board 40. The tab 21a, which is provided on the bus bar 21 in the laminated body 20 disposed on the upper side of the first printed board 30, projects toward the second printed board 40 via the through hole (not shown) in the base plate of the first printed board. A terminal holding member 34 is attached to a bottom side of the first printed board 30. The terminals 32 and 33 are inserted into and held in the through-hole (not shown) in the terminal holding member 34. The tab 21a of the bus bar 21 is inserted into a greater diameter through-hole (not shown) in the terminal holding member 34. Furthermore, guide rods 35 stand at given positions on the terminal holding member 34. Each guide rod 35 is inserted into a guide groove 74 in the longer relay connector 70 mounted on the third printed board 50, so that the longer relay connector 70 is positioned with respect to the first printed board 30.

In this embodiment, a thickness of the conductor 31 on the first printed board 30 is set to be 70 μm, similar to that of the conductor 51 on the third printed board 50, although, as with the third printed board, the thickness of the printed boards are not constrained to this stated thickness.

Figure 6A:
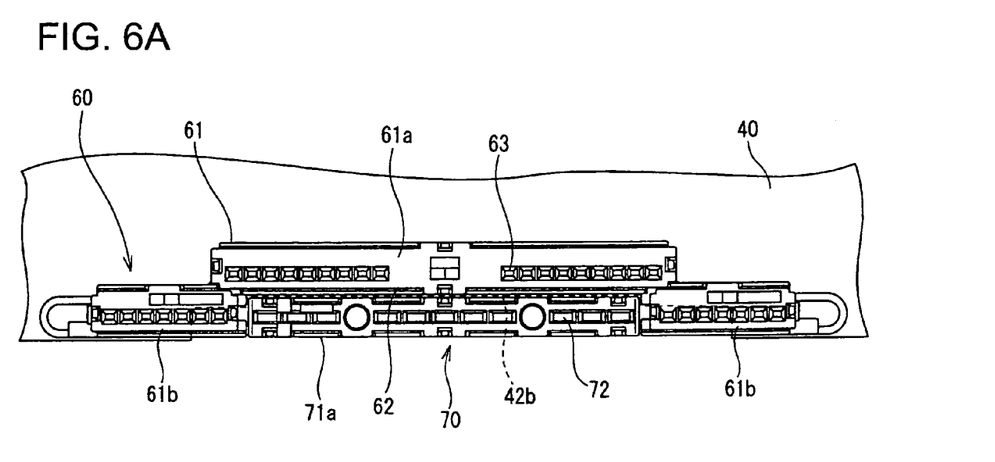
FIG. 6A is a plan view of a combination of second and third printed boards.
Figure 6B:
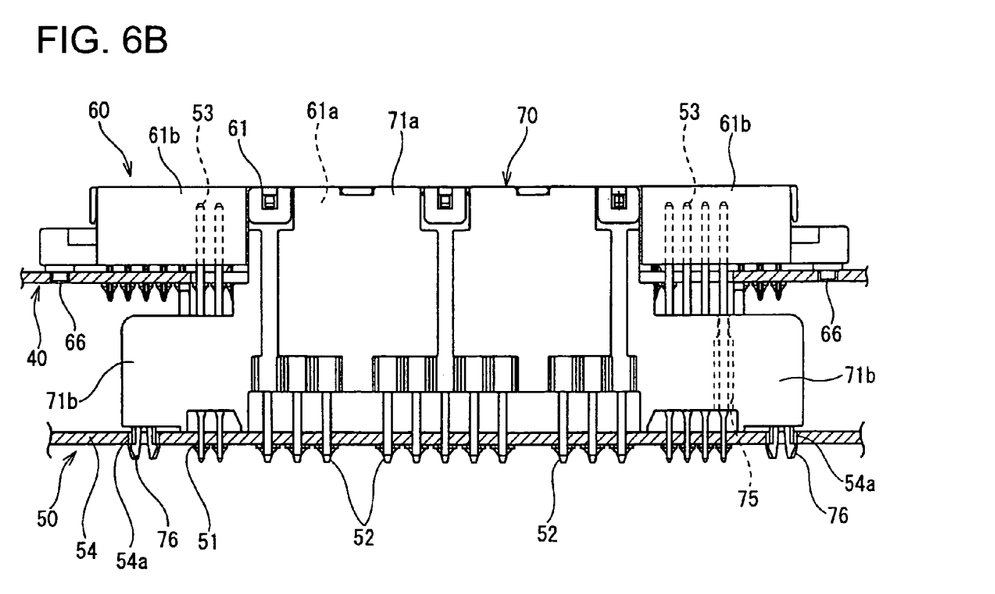
FIG. 6B is a sectional view of FIG. 6A.

When the second and third printed boards 40 and 50 are coupled to each other, as shown in FIG. 6, the longer section 71a of the longer relay connector 70 mounted on the third printed board 50 projects upward from the second printed board 40 through the groove 42b in the base plate 42 of the second printed board 40 and the recess 62 in the shorter relay connector 60 mounted on the second printed board 40. At this time, the top end surface of the shorter relay connector 60 is aligned with the top end surface of the longer relay connector 70 with respect to a vertical direction. The terminal 53 is conducted to the conductor 51 on the third printed board 50 and held by the shorter section 71b of the longer relay connector 70. The terminal 53 is inserted upward into each terminal containing chamber 63 in the shorter relay connector 60 so that the terminal 53 is fitted in the female terminal portion 64a of the shorter relay terminal 64 conducted to the conductor 41 on the second printed board 40. Thus, the conductor 41 of the second printed board 40 is conducted to the conductor 51 of the third printed board 50.

When the laminated body 20, and the first and second printed boards 30 and 40 are coupled to one another, the terminal 33, which is conducted to the conductor 31 on the first printed board 30, is inserted downward into each terminal containing chamber 63 in the shorter relay connector 60 mounted on the second printed board 40 so that the terminal 33 is fitted in the female terminal portion 64a in the shorter relay terminal 64 conducted to the conductor 41 on the second printed board 40. Consequently, the conductor 31 on the first printed board 30 is conducted to the conductor 41 on the second printed board 40.

The terminal 32 conducted to the conductor 31 on the first printed board 30 and the tab 21a provided on the bus bar 21 are inserted downward through the groove 42b in the second printed board 40 into each terminal containing chamber 72 in the longer relay connector 70 that projects from the top side of the second printed board 40. The terminal 32 and tab 21a are fitted in the female terminal portions 73a of the upper side of the longer relay terminal 73 in the terminal containing chamber 72. Thus, the terminal 52, which is conducted through the longer relay terminal 73 to the conductor 51 on the third printed board 50, is connected to the terminal 32 or the tab 21 of the bus bar, which is conducted to the conductor 31 on the first printed board 30. The conductor 31 on the first printed board 30 and the bus bar 21 are conducted to the conductor 51 on the third printed board 50.

The bus bar 21 in the laminated body 20 may be provided with, for example, a press-contact tab 21b for fuse connection, a connector joining tab 21c, a press-contact tab 21d for relay connection or other types of connections. The tabs 21b, 21c, and 21d may extend, for example, into a fuse containing section 11a, a connector containing section 11b, and a relay containing section 11c provided in the upper casing 11, respectively, or into other types of sections.

As shown in FIG. 1, terminals 36 and 37 as well as the terminals 32 and 33 are soldered on the conductor 31 on the first printed board 30. The terminals 36 and 37 project into a connector containing section 11b provided in the upper casing 11 and a connector containing section 12a provided in the intermediate casing 12. Other arrangements, quantities, or uses of junction box terminals may also be used in connection with this invention.

As an example of the utility of this invention, FIG. 1 shows a terminal 43 soldered on the conductor 41 on the second printed board 40 so that the terminal 43 projects into a connector containing section 13a in the lower casing 13.

Next, a method for assembling the laminated body 20, and the first, second, and third printed boards 30, 40, and 50 will be described below.

Figure 7A:
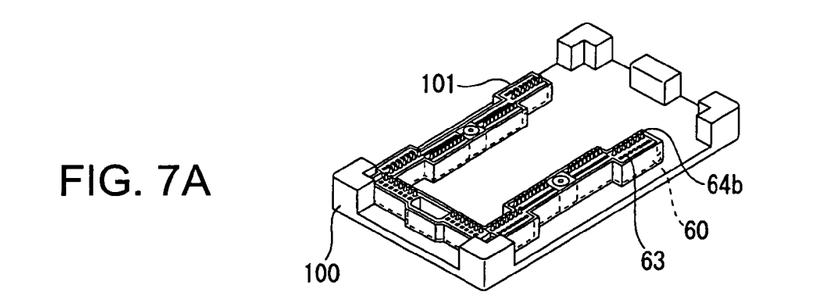
FIGS. 7A through 7D are explanatory views illustrating steps for assembling the second and third printed boards.

First, as shown in FIG. 7A, the shorter relay connector 60 to be mounted on the second printed board 40 is disposed on a connector holding frame 101 of a positioning jig 100 topside down. The shorter relay terminal 64 is received in each terminal containing chamber 63 in the shorter relay connector 60. The male terminal portion 64b of the shorter relay terminal 64 projects upward from the shorter relay connector 60.

Figure 7B:
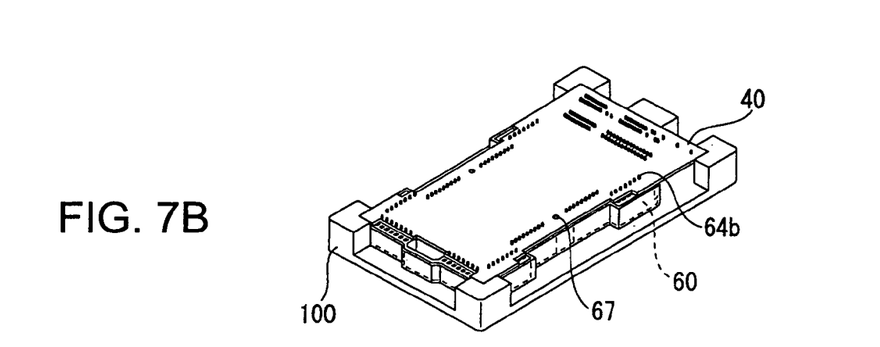

Second, as shown in FIG. 7B, the second printed board 40 is placed on the positioning jig 100 topside down. Screws secure the second printed board 40 and shorter relay connector 60 to each other. The male terminal portion 64b of the shorter relay terminal 64 projecting from the shorter relay connector 60 is inserted into the through-hole in the second printed board 40. The male terminal portion 64b is soldered on the conductor 41.

Figure 7C:
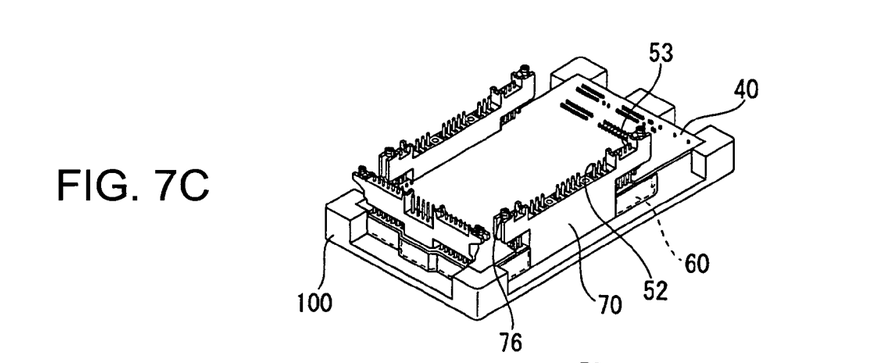

Third, the longer relay terminals 73 and terminals 52 and 53 are attached to the longer relay connector 70 before hand. The longer relay connector 70 is mounted on the positioning jig 100 topside down. In more detail, as shown in FIG. 7C, the longer section 71a of the longer relay connector 70 is inserted into the groove 42b in the second printed board 40 and recess 62 in the shorter relay connector 60. The terminal 53 attached to the longer relay connector 70 is inserted into each terminal containing chamber 63 in the opposite side sections 61b of the shorter relay connector 60 so that the terminal 53 is connected to the female terminal portion 64a of the shorter relay connector 60.

Figure 7D:
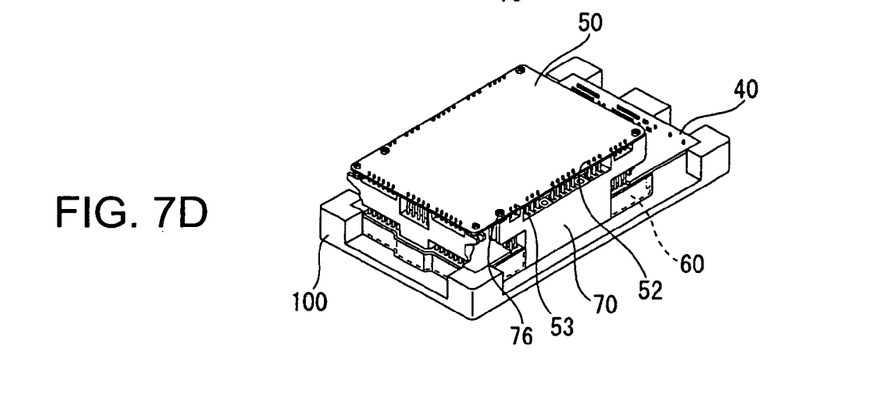

Fourth, as shown in FIG. 7D, the third printed board 50 is placed on the longer relay connector 70 topside down. Clips secure the third printed board 50 to the longer relay connector 70. The terminals 52 and 53 attached to the longer relay connector 70 are inserted into the through-holes in the third printed board 50. The terminals 52 and 53 are soldered on the conductor 51.

Finally, the second and third printed boards 40 and 50 are removed from the positioning jig 100 and are secured to one sidewall of the intermediate casing 12 by pressing. The laminated body 20 and first printed board 30, which were coupled previously, are secured to the other sidewall of the intermediate casing 12. At this time, the tab 21a of the bus bar 21 in the laminated body 20, and the terminals 32 and 33 conducted to the conductor 31 on the first printed board 30 are inserted via the through holes in the intermediate casing 12 into the terminal containing chambers 63 and 72 in the relay connectors 60 and 70 of the second and third printed board 40 and 50. The tab 21a and terminals 32, 33 are connected to the female terminal portions 64a and 73a accommodated in the terminal containing chambers 63 and 72.

According to the above structure, it is possible to interconnect the tab 21a of the bus bar 21, the terminal 32 conducted to the conductor 31 on the first printed board 30, and the terminal 52 conducted to the conductor 51 on the third printed board 50 to one another through the longer relay terminals 73 accommodated in each terminal containing chamber 72 in the longer relay connector 70 mounted on the third printed board 50. It is also possible to interconnect the terminals 33 and 53 conducted to the conductors 31 and 51 on the first and third printed boards 30 and 50 and the conductor 41 on the second printed board 40 to one another through the shorter relay terminals 64 accommodated in each terminal containing chamber 63 in the shorter relay connector 60 mounted on the second printed board 40.

Thus, since the internal circuit in the electrical junction box 10 is divided into the laminated body 20 and the first, second, and third printed boards 30, 40, and 50, it is possible to reduce the size of the laminated body 20 and the printed boards in a horizontal direction and to reduce the size of the electrical junction box 10.

Since the longer section 71a of the longer relay connector 70 mounted on the third printed board 50 projects toward the first printed board 30 through the groove 42b in the second printed board 40, the terminal 32 conducted to the conductor 31 on the first printed board 30 and the terminal 52 conducted to the conductor 51 on the third printed board 50 are readily coupled to each other without making them a long size.

Furthermore, when the second printed board 40 is coupled to the third printed board 50, since the longer section 71a, which connects the terminal 32 conducted to the conductor 31 on the first printed board 30 to the terminal 52 conducted to the conductor 51 on the third printed board 50, merely passes the groove 42b in the second printed board 40, the effort required to connect them may not be as significant as in the prior art, thereby facilitating the assembling work.

Although the laminated body 20, which layers the bus bars and insulation plates alternately, is placed on only the first printed board 30 opposite from the second printed board 40 in the present embodiment, the laminated body 20 may be disposed on the third printed board 40 opposite to the second printed board 40 or on both first and third printed boards 30 and 50 opposite from the second printed board 40.

Figure 8A:
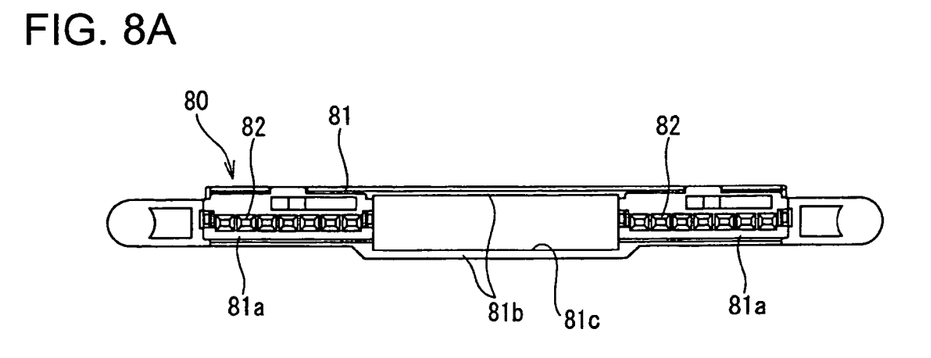
FIG. 8A is a plan view of a shorter relay connector to be mounted on a second printed board in a second embodiment in accordance with the present invention.
Figure 8B:
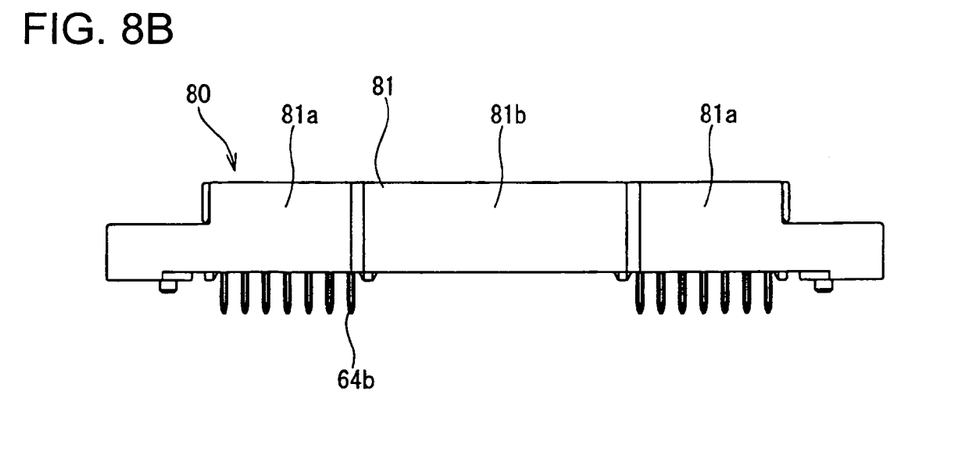
FIG. 8B is a front elevation view of FIG. 8A.
Figure 9A:
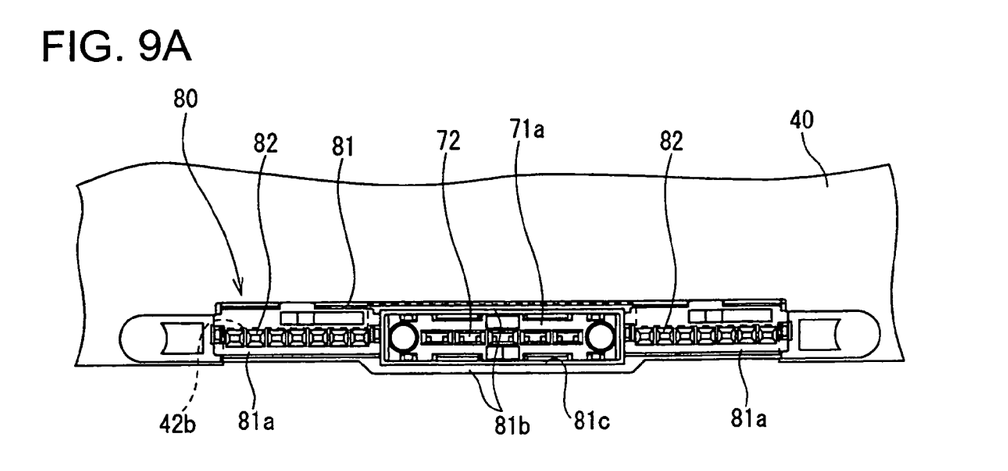
FIG. 9A is a plan view of a combination of second and third printed boards.
Figure 9B:
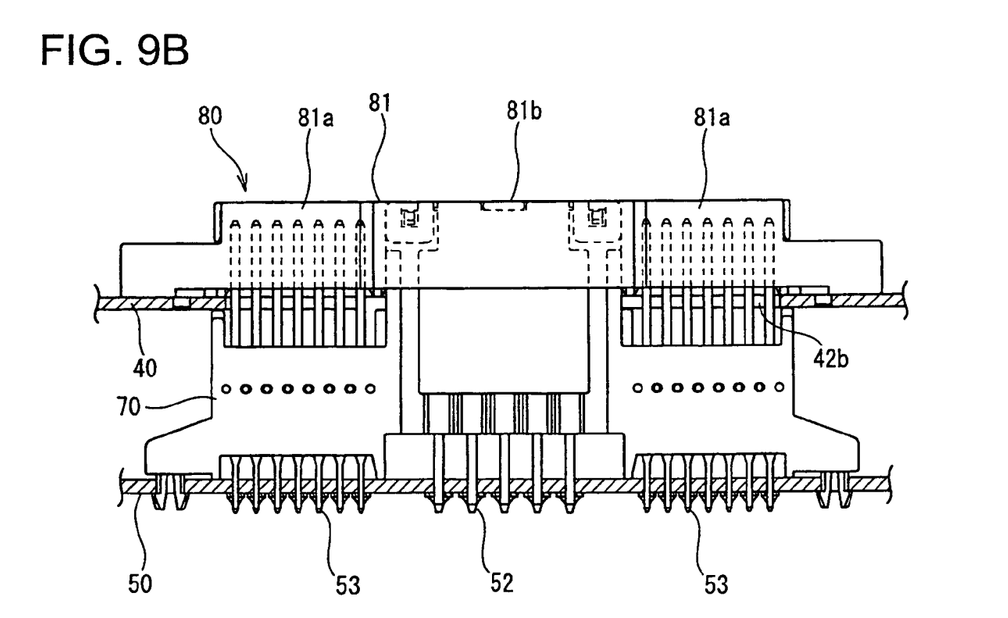
FIG. 9B is a sectional view of FIG. 9A.

FIGS. 8 and 9 show a second embodiment of the present invention.

In the second embodiment, a configuration of a shorter relay connector to be mounted on a second printed board is different from that in the first embodiment.

The shorter relay connector 80 to be mounted on the second printed board includes a housing 81. Opposite side sections 81a of the housing 81 are provided with a plurality of juxtaposed terminal containing chambers 82. Through-hole 81c is provided in a central section between the opposite side sections 81a. Accordingly, although in the first embodiment the terminal containing chambers are provided in the central section at offset positions (shifted positions) from the opposite side sections in the shorter relay connector, the shorter relay connector 80 in the second embodiment is not provided with the terminal containing chambers in the central section and the central section forms a frame 81b for interconnecting the opposite side sections 81a. Although the frame 81b is not essential to the second embodiment, it serves to reinforce the shorter relay connector 80.

Terminal containing chambers 82 accommodate shorter relay terminals 64 similar to those in the first embodiment.

As shown in FIG. 9, the through-hole 81c in the shorter relay connector 80 is arranged to oppose the groove 42b in the second printed board 40. The longer section 71a of the longer relay connector 70 mounted on the third printed board 50 projects through the groove 41b in the second printed board 40 and the through-hole 81c toward the first printed board 30 from the second printed board 40.

According to the above embodiment, it is possible to easily interconnect the conductors on the printed boards similarly to the first embodiment. Even if the terminal containing chambers are not provided in the central section, since the frame 81b on the central section interconnects the opposite side sections, it is possible to enhance the strength of the shorter relay connector 80. Accordingly, when the terminals conducted to the conductors on the first and third printed boards are connected to the shorter relay terminal 64 in the shorter relay connector 80, it is possible to prevent the shorter relay connector 80 from breaking or disconnecting from the second printed board 40 by an external load.

It is possible to facilitate the mounting work of a relay connector onto a printed board in comparison with the case where a separated shorter relay connector is mounted and spaced on the same side of the second printed board 40.

Since the other construction and operational effects in the second embodiment are similar to those in the first embodiment, the explanation of them is omitted.

Figure 10A:
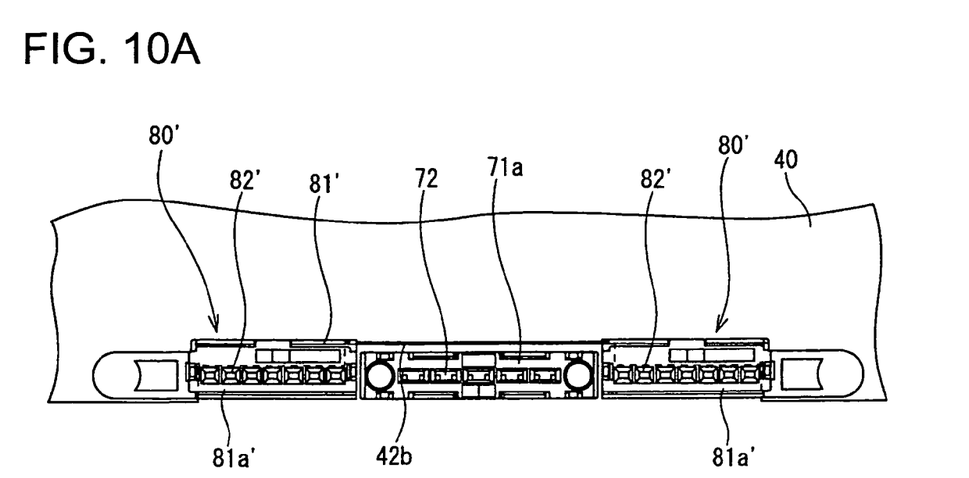
FIG. 10A is a plan view of a combination of second and third printed boards in a third embodiment in accordance with the present invention.
Figure 10B:
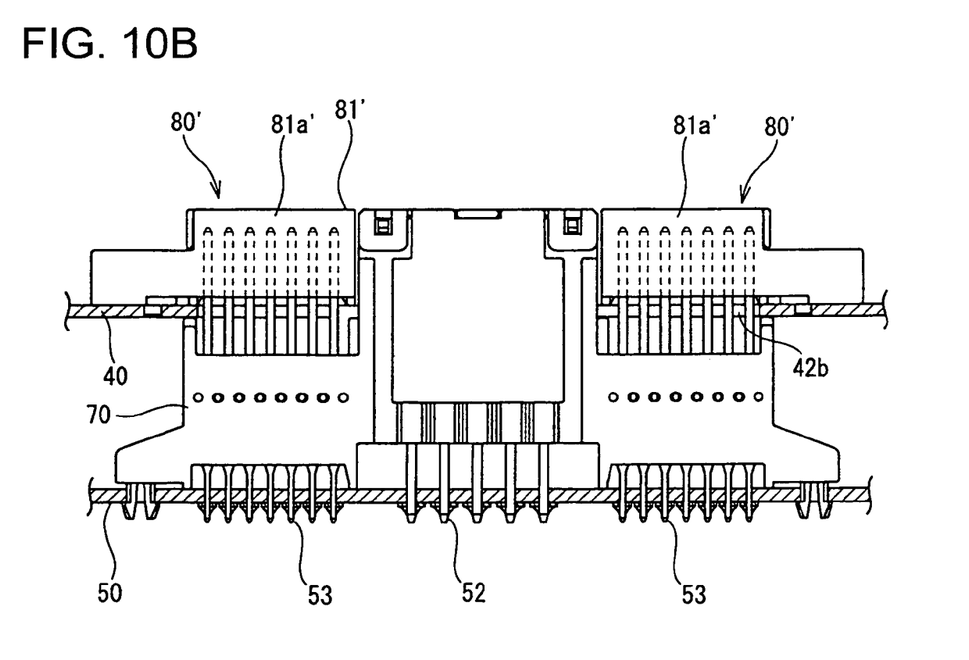
FIG. 10B is a front elevation view of FIG. 10A.

FIG. 10 shows a third embodiment.

A shorter relay connector 80' in the third embodiment has no central section. This is different from the shorter relay connector in the second embodiment because the shorter relay connector 80' in the third embodiment includes only a pair of opposite side sections 81a' provided with terminal containing chambers 82'. Separated shorter relay connector 80' are mounted on the opposite sides of the groove 42b in the second printed board 40.

Accordingly, as shown in FIG. 10, when the second printed board 40 is coupled to the third printed board 50, the longer section 71a of the longer relay connector 70 mounted on the third printed board 50 passes the groove 42b in the second printed board 40 and a space between two shorter relay connectors 80' to project toward the first printed board 30 from the second printed board 40.

Since the other construction and operational effects in the third embodiment are similar to those in the second embodiment.

Although the invention has been described with reference to specific embodiments, those embodiments should be viewed as illustrative and not limiting. Various modifications, substitutions and improvements are possible within the spirit and scope of the invention.

What is claimed is:

1. An electrical junction box comprising:
   at least first, second, and third printed boards contained in a casing assembly so that the printed boards are spaced away from one another in a vertical direction, the second printed board being between the first and third printed boards;
   a first relay connector projecting toward said first printed board is mounted on said second printed board;
   a second relay connector, longer than the first relay connector, projecting toward said first and second printed boards and mounted on said third printed board;
   said second relay connector projecting toward said first printed board through a groove provided in a peripheral edge of said second printed board;
   a first relay terminal, conducted to a conductor on said second printed board, accommodated in a terminal containing chamber in said first relay connector;
   said first relay terminal accommodated in said terminal containing chamber in said first relay connector and conducted to a conductor on either first or third printed board being connected to said first relay terminal;
   a second relay terminal, longer than said first relay terminal, accommodated in a terminal containing chamber in said second relay connector; and
   said second relay terminal accommodated in said terminal containing chamber in said second relay connector and conducted to conductors on said first and third printed boards being connected to each other through said second relay terminal.

2. An electrical junction box according to claim 1, wherein a laminated body that layers bus bars and insulation plates alternately is mounted on a surface of said first printed board and/or said third printed board opposite from said second printed board, said bus bar and said conductors on said first printed board, and said second printed board and/or said third printed board are connected directly or through said relay terminal to each other.

3. An electrical junction box according to claim 1, wherein a board-mounted relay is mounted on said third printed board, and multiplex operation circuits are mounted on said second printed board.

4. An electrical junction box according to claim 3, wherein a laminated body that layers bus bars and insulation plates alternately is mounted on surfaces of a surface of said first printed board and/or said third printed board opposite from said second printed board, said bus bar and said conductors on said first printed board, and said second printed board and/or said third printed board are connected directly or through said relay terminal to each other.

5. An electrical junction box according to claim 1, wherein said first relay connector comprises two short sections mounted on opposite sides of said groove in said second printed board, and said second relay connector mounted on said third printed board projects from said second printed board toward said first printed board through said groove in said second printed board.

6. An electrical junction box according to claim 5, wherein a laminated body that layers bus bars and insulation plates alternately is mounted on surfaces of a surface of said first printed board and/or said third printed board opposite from said second printed board, said bus bar and said conductors on said first printed board, and said second printed board and/or said third printed board are connected directly or through said relay terminal to each other.

7. An electrical junction box according to claim 5, wherein a board-mounted relay is mounted on said third printed board, and multiplex operation circuits are mounted on said second printed board.

8. An electrical junction box according to claim 7, wherein a laminated body that layers bus bars and insulation plates alternately is mounted on a surface of said first printed board and/or said third printed board opposite from said second printed board, said bus bar and said conductors on said first printed board, and said second printed board and/or said third printed board are connected directly or through said relay terminal to each other.

9. An electrical junction box according to claim 1, wherein
   said terminal containing chamber for said first relay terminal is provided on each of opposite side sections of said first relay connector on said second printed board,
   a central section between said opposite side ends is provided with a recess or a through-hole,
   said recess or said through-hole is located at a position opposed to said groove in said second printed board, and
   said second relay connector mounted on said third printed board projects from said second printed board toward said first printed board through said groove in said second printed board and said recess or said through-hole in said central section.

10. An electrical junction box according to claim 9, wherein a laminated body that layers bus bars and insulation plates alternately is mounted on surfaces of a surface of said first printed board and/or said third printed board opposite from said second printed board, said bus bar and said conductors on said first printed board, and said second printed board and/or said third printed board are connected directly or through said relay terminal to each other.

11. An electrical junction box according to claim 9, wherein a board-mounted relay is mounted on said third printed board, and multiplex operation circuits are mounted on said second printed board.

12. An electrical junction box according to claim 11, wherein a laminated body that layers bus bars and insulation plates alternately is mounted on a surface of said first printed board and/or said third printed board opposite from said second printed board, said bus bar and said conductors on said first printed board, and said second printed board and/or said third printed board are connected directly or through said relay terminal to each other.

13. An electrical junction box according to claim 1, wherein
said second relay connector on said third printed board is provided with a long section and a short section, the short section being shorter than the long section and integrated with said long section,
said second relay terminal is accommodated in a terminal containing chamber in said long section,
a terminal conducted to said conductor on said third printed board is inserted into and held in said terminal containing chamber in said short section, and
a projecting end of said terminal is inserted into said terminal containing chamber in said first relay connector on said second printed board to be connected to said first relay terminal.

14. An electrical junction box according to claim 13, wherein a laminated body that layers bus bars and insulation plates alternately is mounted on surfaces of a surface of said first printed board and/or said third printed board opposite from said second printed board, said bus bar and said conductors on said first printed board, and said second printed board and/or said third printed board are connected directly or through said relay terminal to each other.

15. An electrical junction box according to claim 13, wherein a board-mounted relay is mounted on said third printed board, and multiplex operation circuits are mounted on said second printed board.

16. An electrical junction box according to claim 15, wherein a laminated body that layers bus bars and insulation plates alternately is mounted on a surface of said first printed board and/or said third printed board opposite from said second printed board, said bus bar and said conductors on said first printed board, and said second printed board and/or said third printed board are connected directly or through said relay terminal to each other.

17. An electrical junction box according to claim 13, wherein said first connector comprises two relay connectors mounted on opposite sides of said groove in said second printed board, and, said second relay connector mounted on said third printed board projects from said second printed board toward said first printed board through said groove in said second printed board and a space between two first relay connectors mounted on said second printed board.

18. An electrical junction box according to claim 17, wherein a board-mounted relay is mounted on said third printed board, and multiplex operation circuits are mounted on said second printed board.

19. An electrical junction box according to claim 17, wherein a laminated body that layers bus bars and insulation plates alternately is mounted on a surface of said first printed board and/or said third printed board opposite from said second printed board, said bus bar and said conductors on said first printed board, and said second printed board and/or said third printed board are connected directly or through said relay terminal to each other.

20. An electrical junction box according to claim 13, wherein
said terminal containing chamber for said first relay terminal is provided on each of opposite side sections of said first relay connector on said second printed board,
a central section between said opposite side ends is provided with a recess or a through-hole,
said recess or said through-hole is located at a position opposed to said groove in said second printed board, and
said second relay connector mounted on said third printed board projects from said second printed board toward said first printed board through said groove in said second printed board and said recess or said through-hole in said central section.

21. An electrical junction box according to claim 20, wherein a board-mounted relay is mounted on said third printed board, and multiplex operation circuits are mounted on said second printed board.

22. An electrical junction box according to claim 20, wherein a laminated body that layers bus bars and insulation plates alternately is mounted on a surface of said first printed board and/or said third printed board opposite from said second printed board, said bus bar and said conductors on said first printed board, and said second printed board and/or said third printed board are connected directly or through said relay terminal to each other.

* * * * *